United States Patent
Sung et al.

(10) Patent No.: US 11,800,822 B2
(45) Date of Patent: Oct. 24, 2023

(54) MEMORY DEVICE WITH COMPOSITE SPACER

(71) Applicant: TAIWAN SEMICONDUCTOR MANUFACTURING CO., LTD., Hsinchu (TW)

(72) Inventors: Fu-Ting Sung, Taoyuan (TW); Chern-Yow Hsu, Hsinchu County (TW); Shih-Chang Liu, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/572,599

(22) Filed: Jan. 10, 2022

(65) Prior Publication Data
US 2022/0131072 A1 Apr. 28, 2022

Related U.S. Application Data

(60) Continuation of application No. 16/715,868, filed on Dec. 16, 2019, now Pat. No. 11,227,993, which is a (Continued)

(51) Int. Cl.
*H10N 70/20* (2023.01)
*H10N 50/01* (2023.01)
*H10N 70/00* (2023.01)

(52) U.S. Cl.
CPC ............ *H10N 70/24* (2023.02); *H10N 50/01* (2023.02); *H10N 70/011* (2023.02); (Continued)

(58) Field of Classification Search
CPC .......... H01L 45/145–147; H01L 45/04; H01L 45/06; H01L 45/08–085; H01L 45/16–1691; H01L 45/1616; H01L 45/1608; H01L 45/1675; H01L 45/141; H01L 45/12; H01L 45/122; H01L 45/1233; H01L 45/1246; H01L 45/1253; H01L 45/126; H01L 45/1273; H01L 45/14; H01L 45/1666; H01L 45/1641; H01L 45/1683; H01L 45/124; H01L 43/12; H01L 27/10; H01L 27/222–228; H01L 27/2481;
(Continued)

(56) References Cited

U.S. PATENT DOCUMENTS 6,001,538 A 12/1999 Chen et al.
6,190,961 B1 2/2001 Lam
(Continued)

FOREIGN PATENT DOCUMENTS

CN 103811656 A 5/2014

*Primary Examiner* — Natalia A Gondarenko
(74) *Attorney, Agent, or Firm* — Maschoff Brennan

(57) ABSTRACT

A memory device includes a bottom electrode, a magnetic tunnel junction (MTJ) structure, an inner spacer, and an outer spacer. The MTJ structure is over the bottom electrode. The bottom electrode has a top surface extending past opposite sidewalls of the MTJ structure. The inner spacer contacts the top surface of the bottom electrode and one of the opposite sidewalls of the MTJ structure. The outer spacer contacts an outer sidewall of the inner spacer. The outer spacer protrudes from a top surface of the inner spacer by a step height.

20 Claims, 16 Drawing Sheets

Related U.S. Application Data continuation of application No. 15/783,030, filed on Oct. 13, 2017, now Pat. No. 10,510,952, which is a division of application No. 14/740,101, filed on Jun. 15, 2015, now Pat. No. 9,806,254.

(52) U.S. Cl.
CPC ........... *H10N 70/063* (2023.02); *H10N 70/20* (2023.02); *H10N 70/801* (2023.02); *H10N 70/826* (2023.02)

(58) Field of Classification Search
CPC ............... H01L 27/249; H01L 27/1022; H01L 27/1023; H01L 27/1025; H01L 27/1026; H01L 27/105; H01L 27/1052; H01L 27/108; H01L 27/10802; H01L 23/528; H01L 21/762; H01L 21/76205; H01L 21/44; H01L 21/441; H01L 21/461; H01L 21/3213; H01L 21/32135; H01L 21/28141; H01L 21/823468; H01L 21/82386; H10N 50/01; H10N 70/011; H10N 70/061; H10N 70/063; H10N 70/10; H10N 70/20; H10N 70/24; H10N 70/801; H10N 70/821; H10N 70/8265; H10N 70/826; H10N 70/841; H10N 70/8418; H10B 61/00; H10B 61/10; H10B 63/00; H10B 63/10; H10B 63/20; H10B 63/80; H10B 63/82
USPC .... 257/4, 412, 421, 751; 438/382, 585–595, 438/926
See application file for complete search history.

(56) References Cited

U.S. PATENT DOCUMENTS

| | | | |
|---|---|---|---|
| 6,383,878 | B1 | 5/2002 | Huang |
| 7,419,881 | B2 * | 9/2008 | Cho ................... H01L 45/1666 438/383 |
| 8,048,789 | B2 | 11/2011 | Soss |
| 8,048,790 | B2 | 11/2011 | Soss |
| 8,421,166 | B2 | 4/2013 | Chi |
| 8,574,928 | B2 * | 11/2013 | Satoh ................... H01L 27/222 438/738 |
| 8,969,983 | B2 | 3/2015 | Kanaya |
| 9,722,174 | B1 | 8/2017 | Nagel |
| 10,510,952 | B2 | 12/2019 | Sung |
| 2005/0064635 | A1 | 3/2005 | Ajmera et al. |
| 2005/0247975 | A1 | 11/2005 | Kim |
| 2006/0220084 | A1 | 10/2006 | Umehara |
| 2008/0265322 | A1 | 10/2008 | Lin et al. |
| 2009/0108415 | A1 | 4/2009 | Lenski et al. |
| 2012/0001145 | A1 | 1/2012 | Magistretti et al. |
| 2013/0119494 | A1 | 5/2013 | Li |
| 2013/0140515 | A1 | 6/2013 | Kawashima |
| 2013/0240824 | A1 * | 9/2013 | Oh ......................... H01L 45/06 257/4 |
| 2014/0070162 | A1 | 3/2014 | Iwayama |
| 2014/0131650 | A1 | 5/2014 | Tu et al. |
| 2014/0131654 | A1 | 5/2014 | Tu |
| 2014/0191301 | A1 | 7/2014 | He et al. |
| 2014/0248626 | A1 | 9/2014 | Kang |
| 2015/0171142 | A1 | 6/2015 | Kawashima |
| 2015/0171314 | A1 | 6/2015 | Li |
| 2015/0243708 | A1 | 8/2015 | Ravasio et al. |
| 2015/0263267 | A1 | 9/2015 | Kanaya |
| 2016/0072047 | A1 * | 3/2016 | Seto ........................ H01L 43/08 257/421 |

\* cited by examiner

MEMORY DEVICE WITH COMPOSITE SPACER

RELATED APPLICATIONS

This application is a continuation of U.S. patent application Ser. No. 16/715,868, filed Dec. 16, 2019, now U.S. Pat. No. 11,227,993, issued Jan. 18, 2022, which is a continuation of U.S. patent application Ser. No. 15/783,030, filed Oct. 13, 2017, now U.S. Pat. No. 10,510,952, issued Dec. 17, 2019, which is a divisional of U.S. patent application Ser. No. 14/740,101, filed Jun. 15, 2015, now U.S. Pat. No. 9,806,254, issued Oct. 31, 2017, all of which are herein incorporated by reference in their entirety.

BACKGROUND

Semiconductor products are used in a variety of electronic application, such as person computers, cell phones, digital cameras, and other electronic equipments. For instance, memory devices such as random-access memories (RAM) are necessarily used in many electronic devices. The semiconductor integrated circuit (IC) industry has experienced rapid growth. Technological progress in IC manufacture has produced several generations of ICs, and each generation fabricates smaller and more complex circuits than the previous generation. Several advanced techniques have been developed to implement technique nodes with smaller feature sizes, and these techniques are employed in the manufacturing of the storage devices, for example. However, while the feature size is smaller than a certain dimension, some processes have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
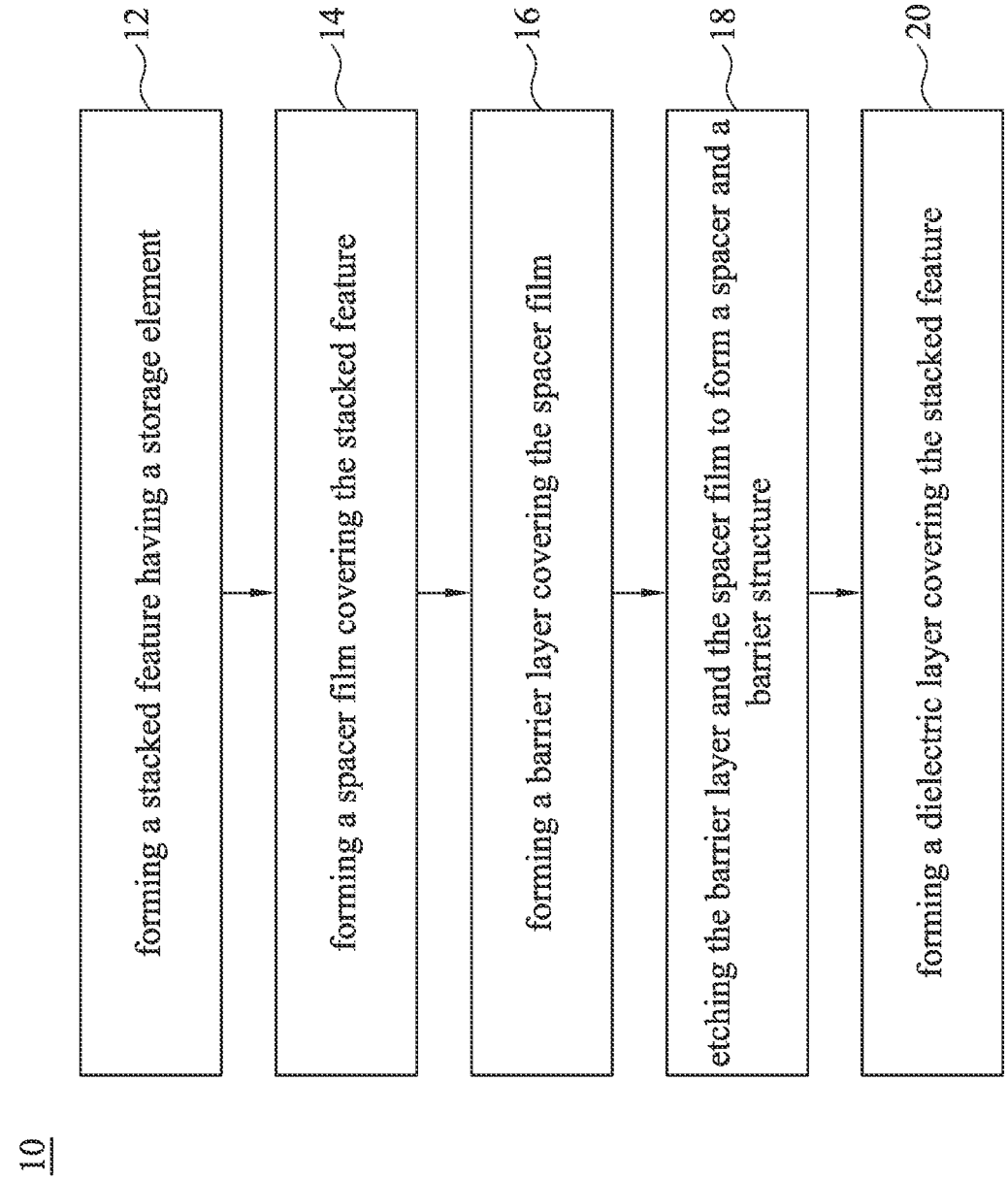
FIG. 1 is a flow chart illustrating a method of forming a storage device according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The semiconductor industry has continually improved the speed and power of integrated circuits (ICs) by reducing the size of components within the ICs. Several advanced techniques have been developed to implement technique nodes with smaller feature sizes, and these techniques are employed in the manufacturing of the storage devices, for example. However, while the feature size is smaller than a certain dimension such as for example about 40 nm (i.e. technique node 40) or less, some processes suffer from misalignment and overlay problems that degrade device performance and decrease the manufacture yield. Accordingly, one of the aspects of the present disclosure is to provide a solution to the misalignment problems.

The present disclosure relates generally to a semiconductor device such as for example a storage device and a method of manufacturing the storage device. In examples, the storage device may be, for example, a magnetoresistive random-access memory (MRAM), resistive random-access memory (RRAM), conductive-bridging random-access memory (CBRAM) or the like. According to various embodiments of the present disclosure, the semiconductor device or the storage device has a composite spacer with a shape that is different from the spacer in typical semiconductor devices. Various embodiments of the present disclosure will be described in detail hereinafter.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIG. 1 is a flow chart illustrating a method 10 of forming a storage device according to various embodiments of the present disclosure. The method 10 includes operation 12, operation 14, operation 16, operation 18 and operation 20. FIGS. 3-15 collectively illustrate more detailed manufacturing methods as a series of cross-sectional views in accordance with various embodiments of the present disclosure. It will be appreciated that although these methods each illustrate a number of operations, acts and/or features, not all of these operations, acts and/or features are necessarily required, and other un-illustrated operations, acts and/or features may also be present. Also, the ordering of the operations and/or acts in some embodiments can vary from what is illustrated in these figures. In addition, the illustrated acts can be further divided into sub-acts in some implementations, while in other implementations some of the illustrated acts can be carried out concurrently with one another.

Figure 2:
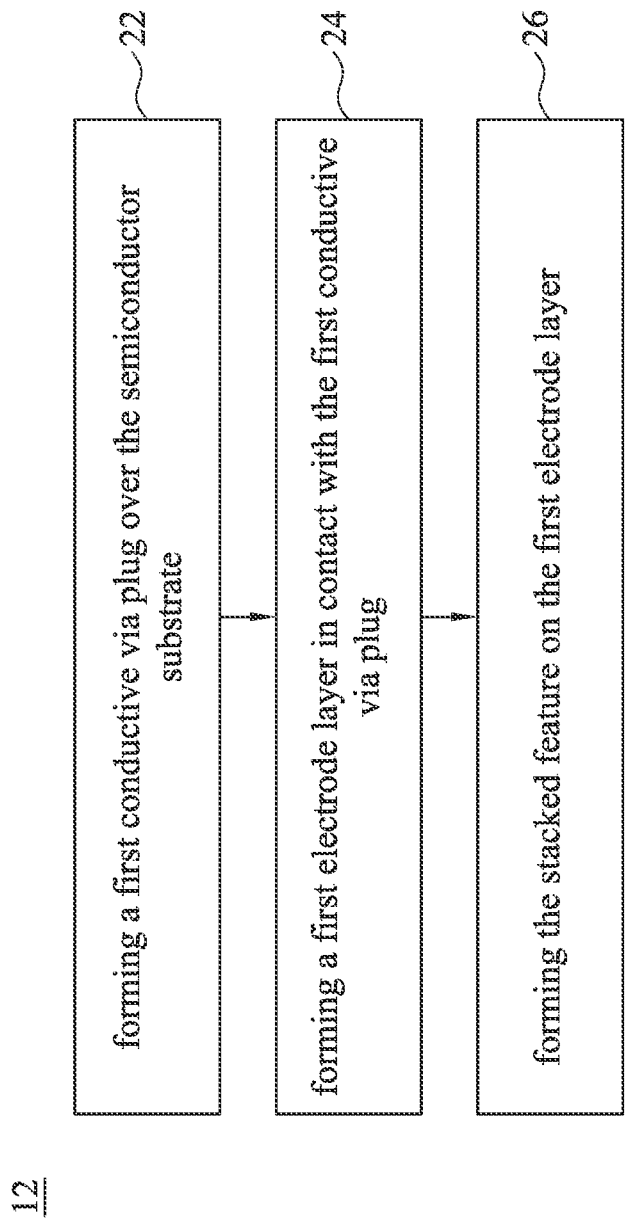
FIG. 2 illustrating an approach to implement the operation 12 in a flowchart format according to some embodiments of the present disclosure.

Referring to operation 12 of FIG. 1, a stacked feature having a storage element is formed over a semiconductor substrate. FIG. 2 illustrating an approach to implement the operation 12 in a flowchart format according to some embodiments of the present disclosure. As shown in FIG. 2, the operation 12 includes act 22, act 24 and act 26. In addition, FIGS. 3-9 depict cross-sectional views at various fabrication stages in the operation 12 according to some embodiments of the present disclosure. It should be noted that the fabrication stages as well as the features in connection with FIGS. 3-9 are merely examples. A person skilled in the art will recognize there may be many alternatives, variations and modifications.

Figure 3:
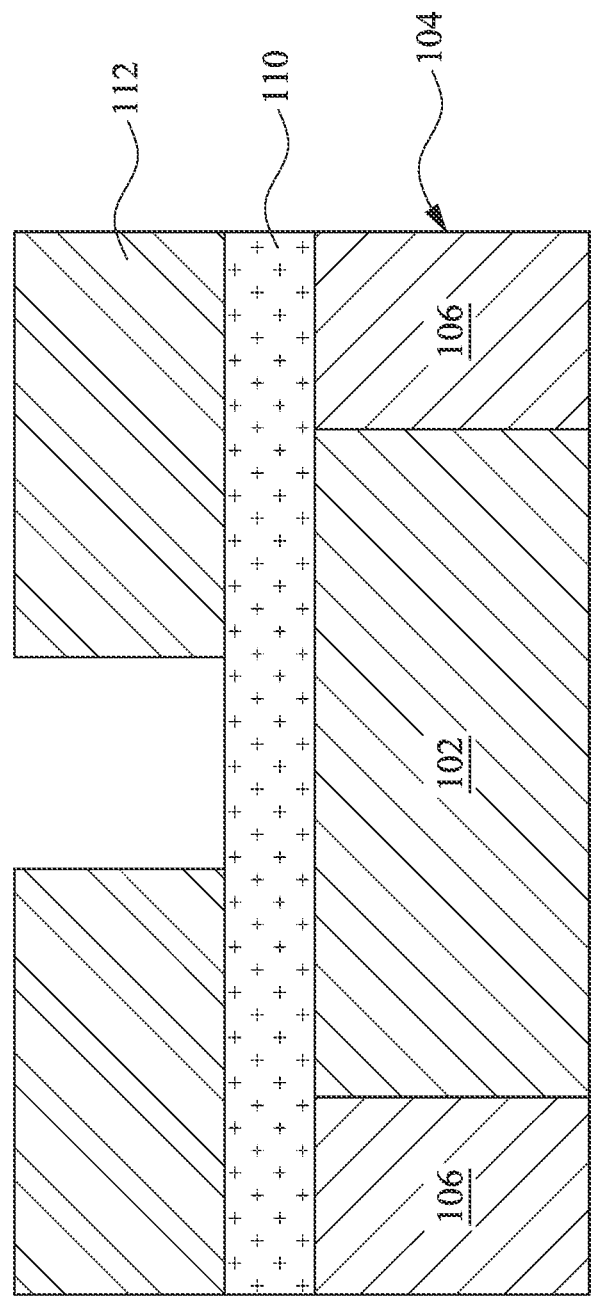
FIGS. 3-15 are cross-sectional views schematically illustrating a method of forming a storage device in various process stages according to various embodiment of the present disclosure.
Figure 4:
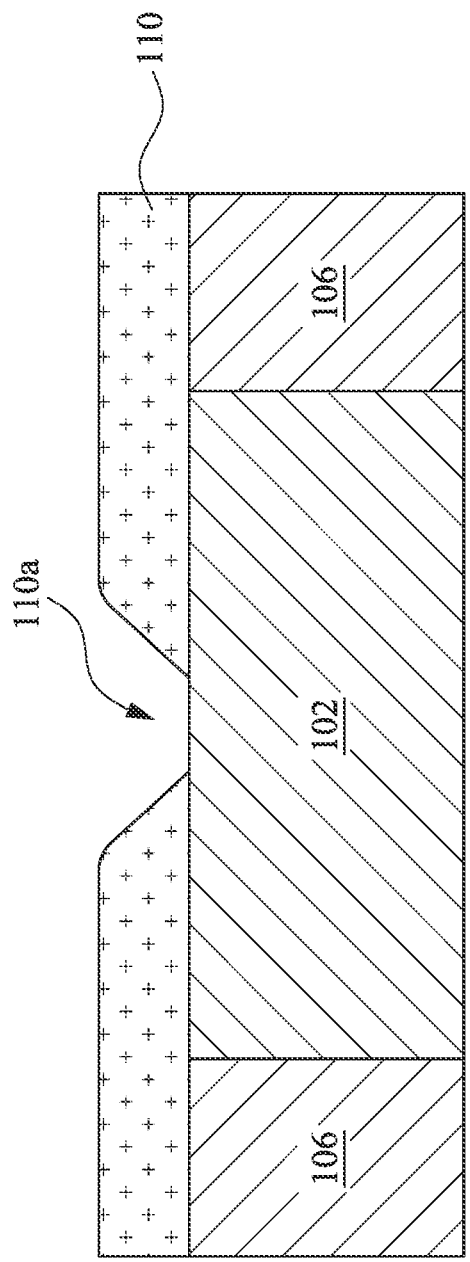

In act 22, a first conductive via plug 102 is formed on the semiconductor substrate 104, as illustrated in FIG. 3. In some embodiments, the semiconductor substrate 104 may include a dielectric layer 106, and the first conductive via plug 102 is formed in the dielectric layer 106. The dielectric layer 106 may include polybenzoxazole (PBO), polyimide, benzocyclobutene (BCB), phosphosilicate glass (PSG), borosilicate glass (BSG), boron-doped phosphosilicate glass (BPSG), silicon nitride, silicon oxide, any combinations thereof and/or the like. The dielectric layer 210 may be formed by many suitable approaches such as spinning coating, chemical vapor deposition (CVD), and plasma enhanced CVD (PECVD) and/or the like. The semiconductor substrate 104 may include, for example, bulk silicon, doped or undoped, or an active layer of a semiconductor-on-insulator (SOI) substrate. Other substrates, such as a multi-layered or gradient substrate may also be used. In some embodiments, write word lines and/or read word lines (not shown) may be formed under the first conductive via plug 102 and the dielectric layer 106. Further, one of more transistors (not shown) may be formed under the first conductive via plug 102 and the dielectric layer 106 in the semiconductor substrate 104, and the transistors are electrically connected to the first conductive via plug 102 through the write word lines and/or read word lines.

In act 24, a first electrode layer is formed over and in contact with the first conductive via plug 102, as illustrated in FIGS. 3-6. In some embodiments, before the first electrode layer is formed, a first dielectric layer 110 is deposited over the semiconductor substrate 104 as shown in FIG. 3. The first dielectric layer 110 may include silicon nitride (SiN), silicon carbide (SiC), silicon oxy-nitride (SiON), or nitrogen-free anti-reflective coating (NFARC) material such as for example SiCO and SiCOH, or the like or the combination thereof. The first dielectric layer 110 may be formed by suitable approaches such as chemical vapor deposition (CVD), plasma enhanced CVD (PECVD), spinning coating and/or the like. The first dielectric layer 110 may be patterned using a mask layer 112 such that an aperture 110a is formed in the first dielectric layer 110, as illustrate in FIG. 4. The aperture 110a exposes at least a portion of the first conductive via plug 102 according to some examples of the present disclosure.

Figure 5:
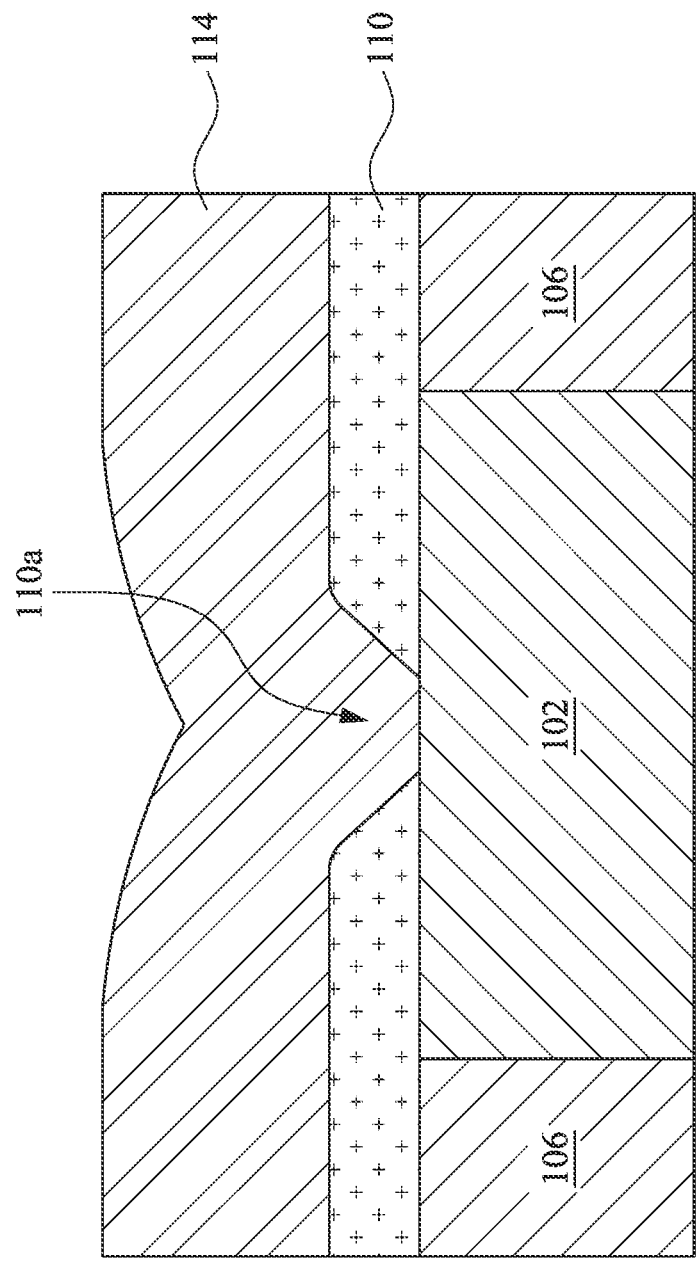
Figure 6:
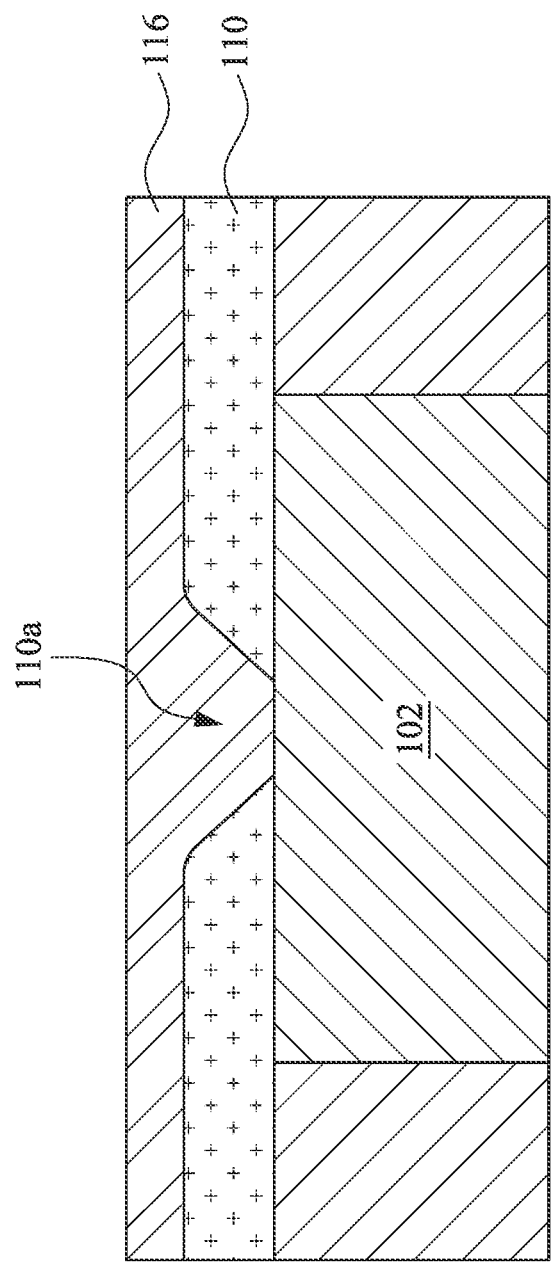

In FIG. 5, a conductive material layer 114 is deposited on the first dielectric layer 110. The conductive material layer 114 covers the first dielectric layer 110 and fills the aperture 110a. Thereafter, a planarization process, such as for example a chemical-mechanical polishing (CMP) process, is performed on the conductive material layer 114 so as to form the first electrode layer 116, as shown in FIG. 6. The first electrode layer 116 is in contact with the first conductive via plug 102 through the aperture 110a. The first electrode layer 116 may include Ti, Ta, TiN, TaN, or other suitable metals or materials, and may be formed by physical vapor deposition processes, chemical vapor deposition processes or other suitable methods.

Figure 7:
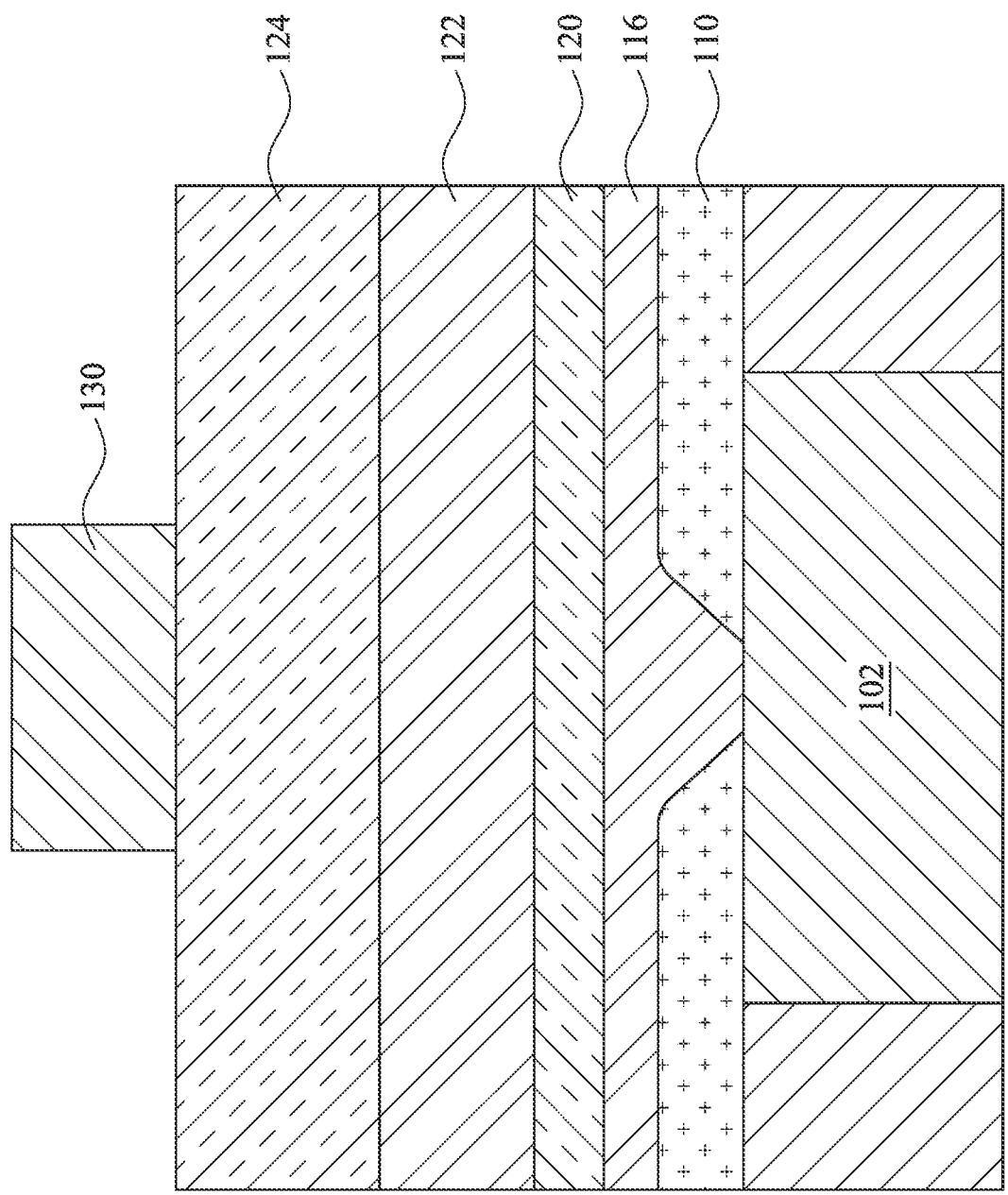
Figure 8:
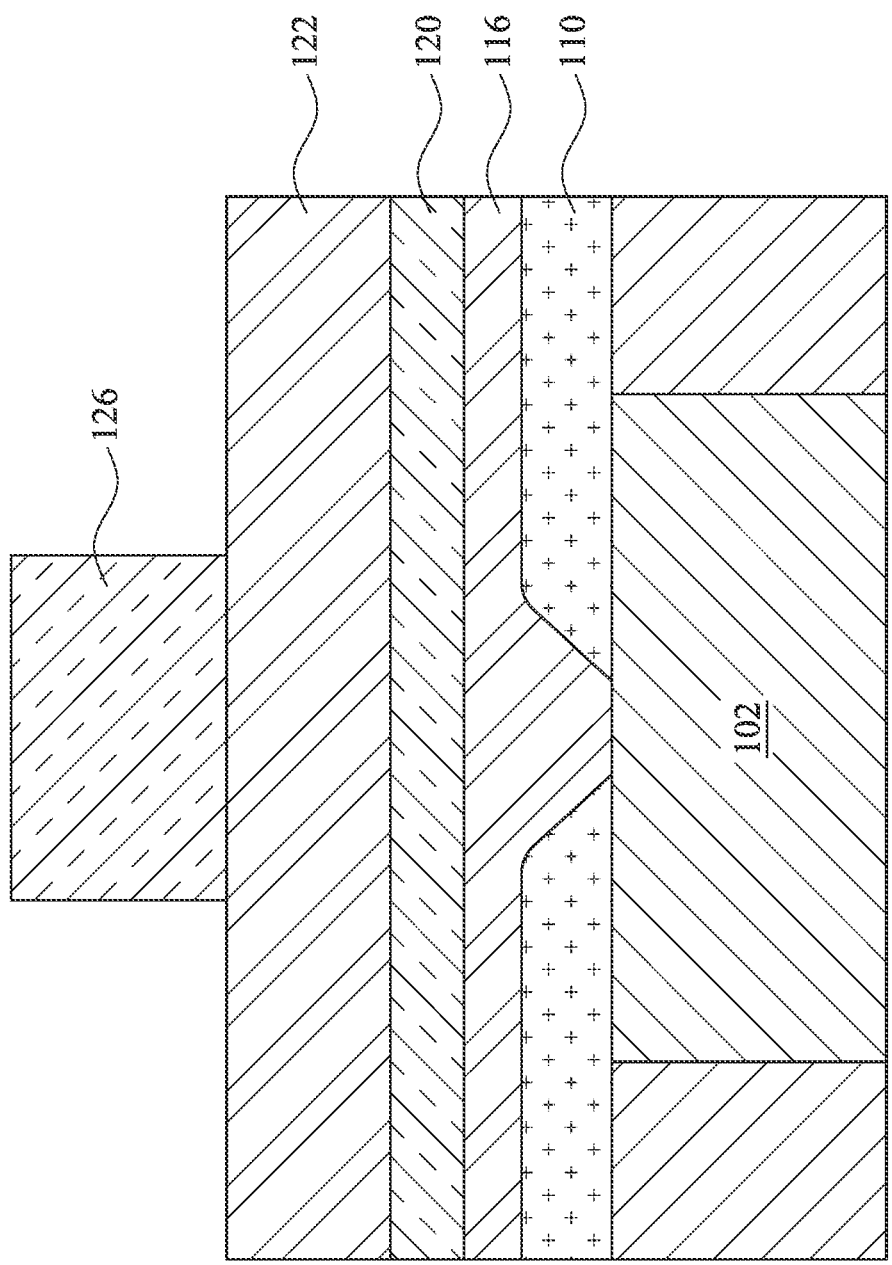
Figure 9:
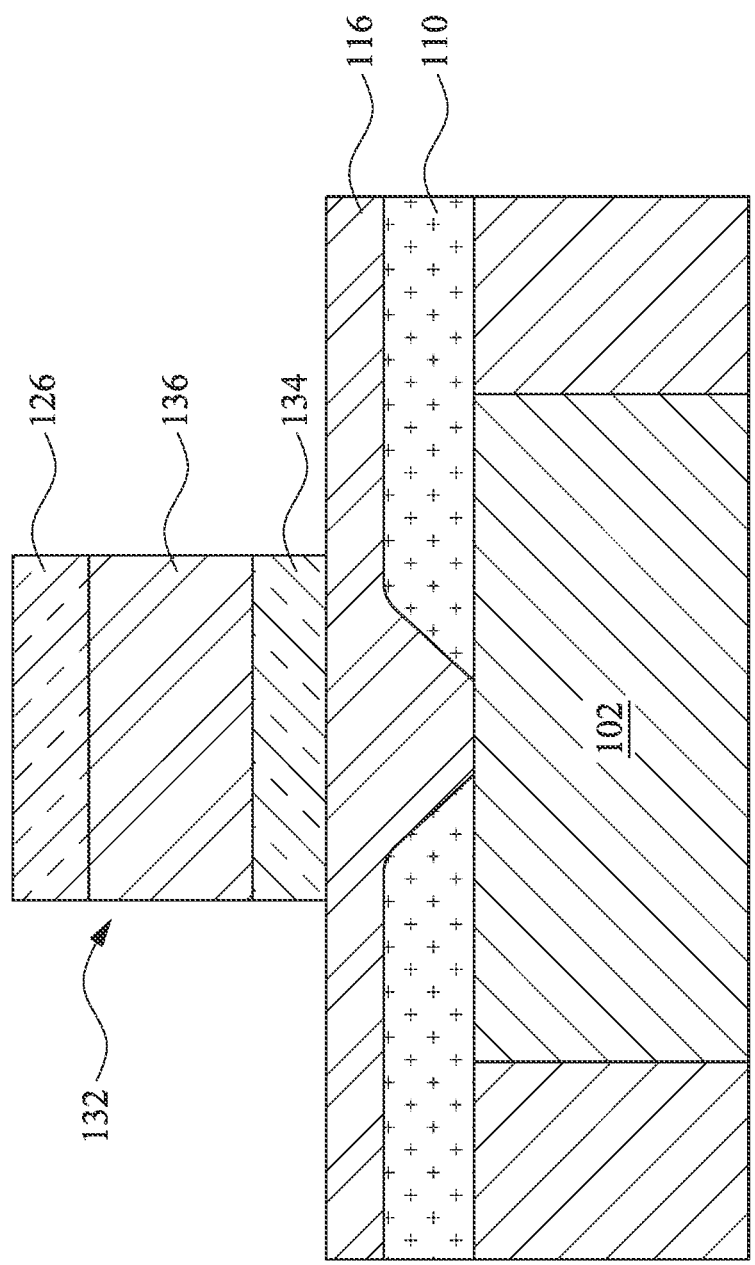

In act 26, the stacked feature is formed on the first electrode layer 116, as illustrated in FIGS. 7-9. Referring to FIG. 7, a storage material layer 120 is formed overlaying the first electrode layer 116, and subsequently a second electrode layer 122 is formed overlaying the storage material layer 120 according to various embodiments of the present disclosure. In some embodiments, the storage material layer 120 may include multiple layers. For example, the storage material layer 120 may include a magnetic tunnel junction (MTJ) stack having a free synthetic antiferromagnetic ("SAP") layer (not shown), a pinned SAF layer (not shown) and a tunnel barrier layer (not shown) interposed there between. Further, the free SAF layer may include a plurality of ferromagnetic layers (not shown) and at least one antiferromagnetic coupling spacer layers (not shown) interposed between two adjacent ones of the ferromagnetic layers. The pinned SAF layer may include a pinned ferromagnetic layer (not shown), a fixed ferromagnetic layer (not shown) and an antiferromagnetic coupling spacer layer (not shown) interposed there between. The materials for the tunnel barrier layer may include electrically insulating materials that form a tunneling junction. Examples of such materials include MgO, AlN, TaN, and/or $Ta_2O_5$. In some examples, the MTJ stack includes Co, Fe, B, Ni, Mg, Mo, or Ru, or the like, or a combination thereof. MTJ stack can be manufactured by thin film technologies, such as magnetron sputter deposition, molecular beam epitaxy, pulsed laser deposition, electron beam physical vapor deposition, or any other suitable methods.

In some embodiments, the storage material layer 120 may include materials used in RRAMs or CBRAMs. For example, the storage material layer 120 may include $Ge_2Sb_2Te_5$, AgInSbTe, NiO, $TiO_2$, $Sr(Zr)TiO_3$, GeS, GeSe, $Cu_2S$, or the like, or a combination thereof.

The second electrode layer 122 may include Ti, Ta, TiN, TaN, or other suitable metals, and may be formed by physical vapor deposition processes, chemical vapor deposition processes or other suitable methods. The material of the second electrode layer 122 may be the same as or different from that of the first electrode layer 116.

Thereafter, a hard mask layer 124 is deposited on the second electrode layer 122, and followed by lithography and etching processes to form a patterned mask layer 126, as shown in FIG. 8. In specifics, a patterned photoresist layer 130 may be formed on the hard mask layer 124, and then the hard mask layer 124 is etched to form the patterned mask layer 126.

In FIG. 9, a patterning process is carried out on the storage material layer 120 and the second electrode layer 122 using the patterned mask layer 126 so as to form the stacked feature 132 including a storage element 134 and a second electrode 136. In some embodiments, the stacked feature 132 includes a remained portion of the patterned mask layer 126 located on the second electrode 136. The storage material layer 120 and the second electrode layer 122 may be patterned by any suitable etching techniques such as for example dry plasma etching process and reactive ion etching (RIE) techniques.

The acts 22, 24 and 26 illustrated in FIG. 2 provides approaches to implement the operation 12 of forming the stacked feature 132, which at least includes the storage element 134 according to various embodiments of the present disclosure. In some embodiments, the stacked feature 132 further includes the second electrode 136 stacked on the storage element 134. In yet some embodiments, the storage element 134 and second electrode 136 have an identical pattern.

Figure 10:
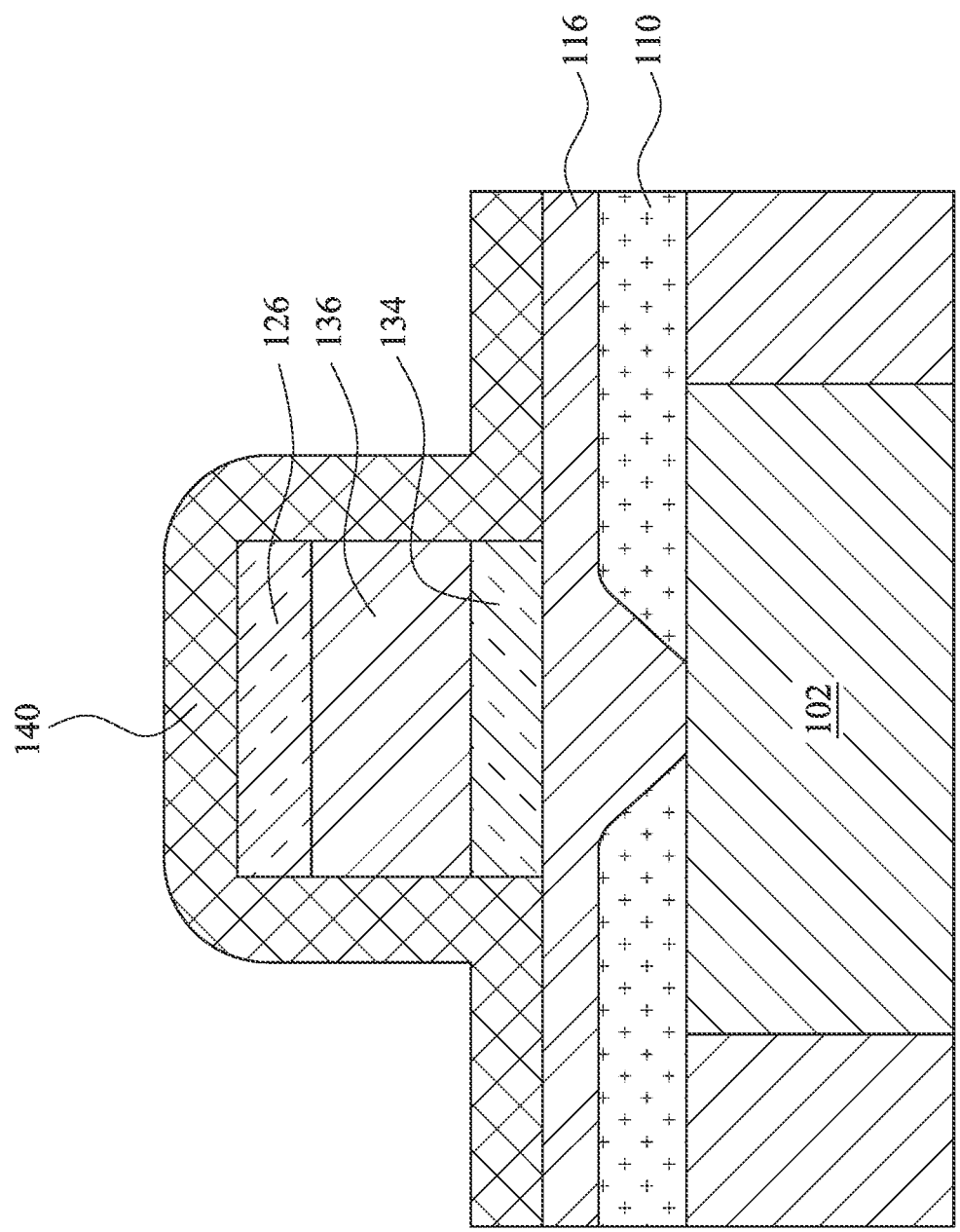

Turning to operation 14 in FIG. 1, a spacer film 140 is formed to cover the stacked feature 132, as shown in FIG. 10. In some embodiments, the spacer film 140 may include silicon nitride (SiN), silicon carbide (SiC), silicon oxynitride (SiON), or nitrogen-free anti-reflective coating (NF ARC) material such as for example SiCO and SiCOH, or the like or a combination thereof, and the spacer film 140 may be formed by any suitable approach such as chemical vapor deposition (CVD), plasma enhanced CVD (PECVD), spinning coating and/or the like. In some embodiments, the thickness of the spacer film 140 may be about 15 nm to about 100 nm, specifically about 25 nm to about 80 nm, more specifically about 30 nm to about 60 nm. In addition, according to some examples of this disclosure, the spacer film 140 is conformally deposited over the stacked feature 132 that includes the storage element 134, the second electrode 136 and the remained patterned mask layer 126.

Figure 11:
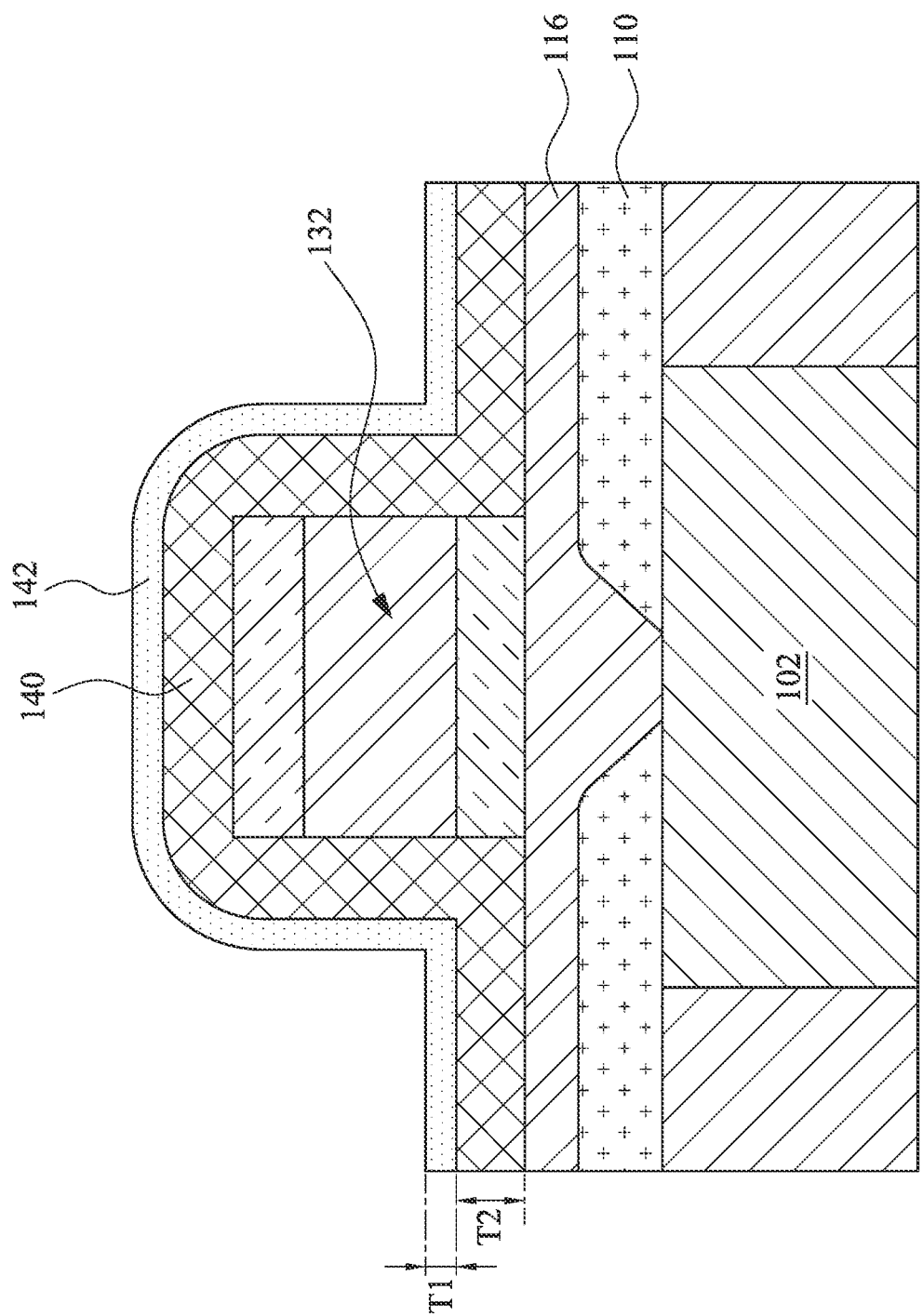

In operation 16, a barrier layer 142 is formed to cover the spacer film 140, as shown in FIG. 11. In some embodiments, the etching resistance of the material constituting the barrier layer 142 is greater than that of the material constituting the spacer film 140. In examples, the barrier layer 142 may include undoped silica glass (USG), fluorine silica glass (FSG), tetraethyl orthosilicate (TEOS)-based oxide, or the like, or a combination thereof. In yet some embodiments, the thickness Ti of the barrier layer 142 is approximately 5-35% of the thickness T2 of the spacer film 140, specifically approximately 10-30% of the thickness T2. In some examples, when the thickness T1 of the barrier layer 142 is greater than a certain value such as for example 35% of the thickness T2, it is unfavorable to the subsequent operation 18. In contrast, when the thickness T1 of the barrier layer 142 is less than a certain value such as for example 5% of the thickness T2, the barrier layer 142 may be insufficient to control the shape of certain features in the subsequent operation 18, and this is described in detail hereinafter. In some examples, the thickness Ti of the barrier layer 142 may be about 5 nm to about 30 nm, specifically about 7 nm to about 20 nm, more specifically about 8 nm to about 15 nm.

Figure 12:
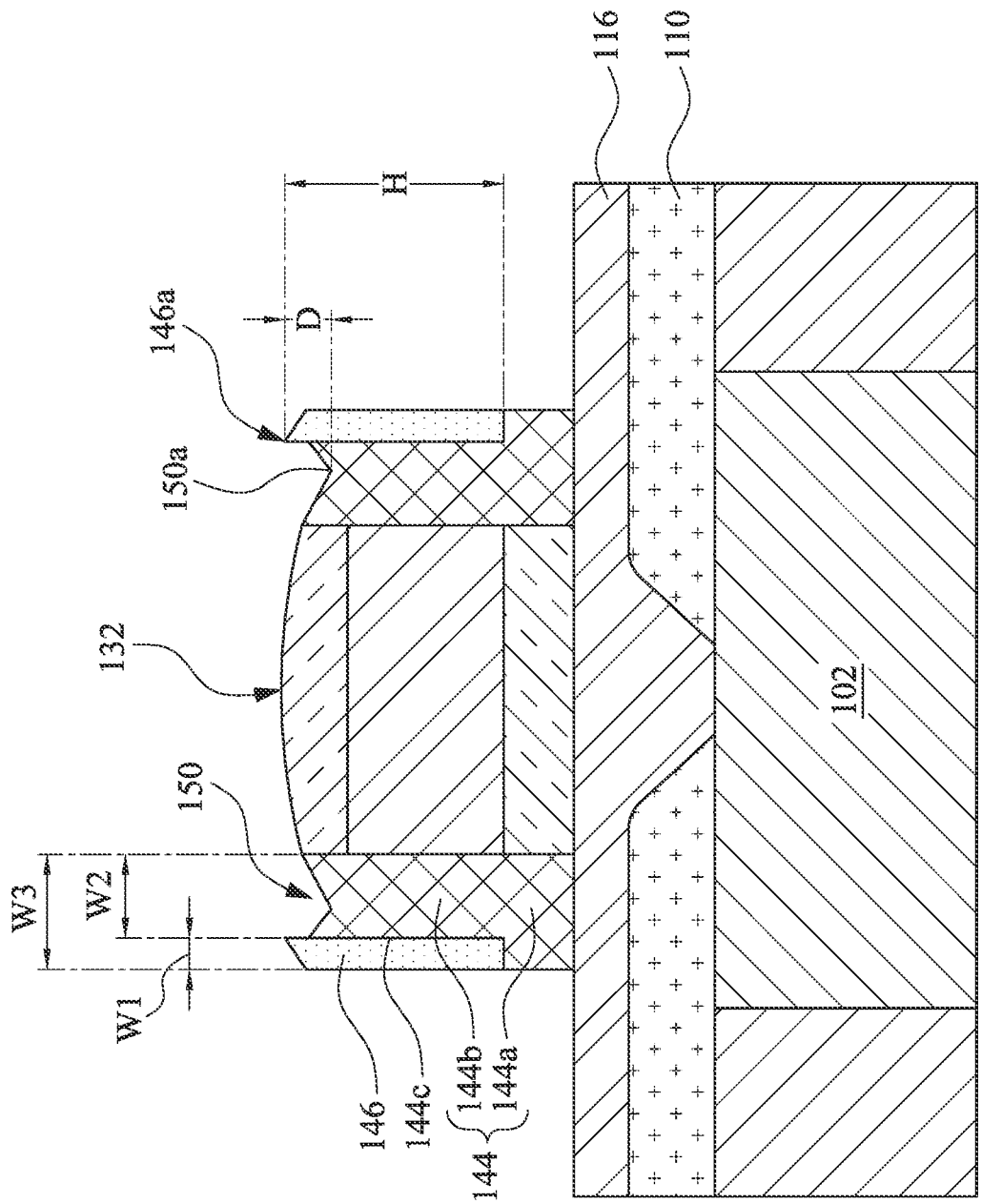

In operation 18, an etching process is performed on the barrier layer 142 and the spacer film 140 using an etchant so as to form a spacer 144 and a barrier structure 146, as shown in FIG. 12. The spacer 144 is positioned on the sidewall of the stacked feature 132, and further the barrier structure 146 is embedded in a lateral 144c of the spacer 144. In some embodiments, the etching process in operation 18 is a dry etching process, in which no photoresist layer is provide on the barrier layer 142, and therefore the barrier layer 142 and the spacer film 140 are etched in a comprehensive manner. Furthermore, because the etching resistance to the etchant of the barrier layer 142 is greater than that of the spacer film 140, the obtained spacer 144 and barrier structure 146 have a particular shape. Particularly, a notch 150 is formed on a top surface of the spacer 144, and the obtained spacer 144 has a sufficient thickness since the barrier layer 142 restrains the etching exerted on the lateral 144c of the spacer 144. The spacer 144 and the barrier layer 142 constitute a composite spacer on the sidewall the stacked feature 132.

In some embodiments, the spacer 144 includes a bottom portion 144a and a standing portion 144b extending upwards from the bottom portion 144a, and the width W3 of the bottom portion 144a is greater than the width W2 of the standing portion 144b. In some embodiments, the barrier structure 146 stands on the bottom portion 144a and in contact with the lateral 144c of the standing portion 144b.

In yet some embodiments, the operation 18 of etching the barrier layer 142 and the spacer film 140 further constitutes a taper top 146a of the barrier structure 146, as shown in FIG. 12. In some examples, the notch 150 of the spacer 144 has a bottom 150a positioned at a level below the taper top 146a of the barrier structure 146. In yet some examples, the distance D between the taper top 146a and the bottom 150a of the notch 150 defines the depth D of the notch 150, and the depth D of the notch 150 is approximately 3-30% of the height H of the barrier structure 146. For example, the depth D is approximately 3-15% of the height H, or approximately 10-30% of the height H.

In yet some embodiments, the width W1 of the barrier structure 146 is approximately 5-35% of the width W2 of the standing portion 144b of the spacer 144, specifically approximately 10-30% of the width W2.

The etching rate of the spacer film 140 is at least 8 folds of that of the barrier layer 142 in the operation 18 according to various embodiments of the present disclosure. In some examples, the etchant used in the operation 18 includes halogen. In yet some examples, the etchant includes F, Cl and Br. In yet some examples, the etchant includes at least one of $CH_2F_2$, $CF_4$, HBr, $Cl_2$, or the like, or a mixture thereof.

Figure 13:
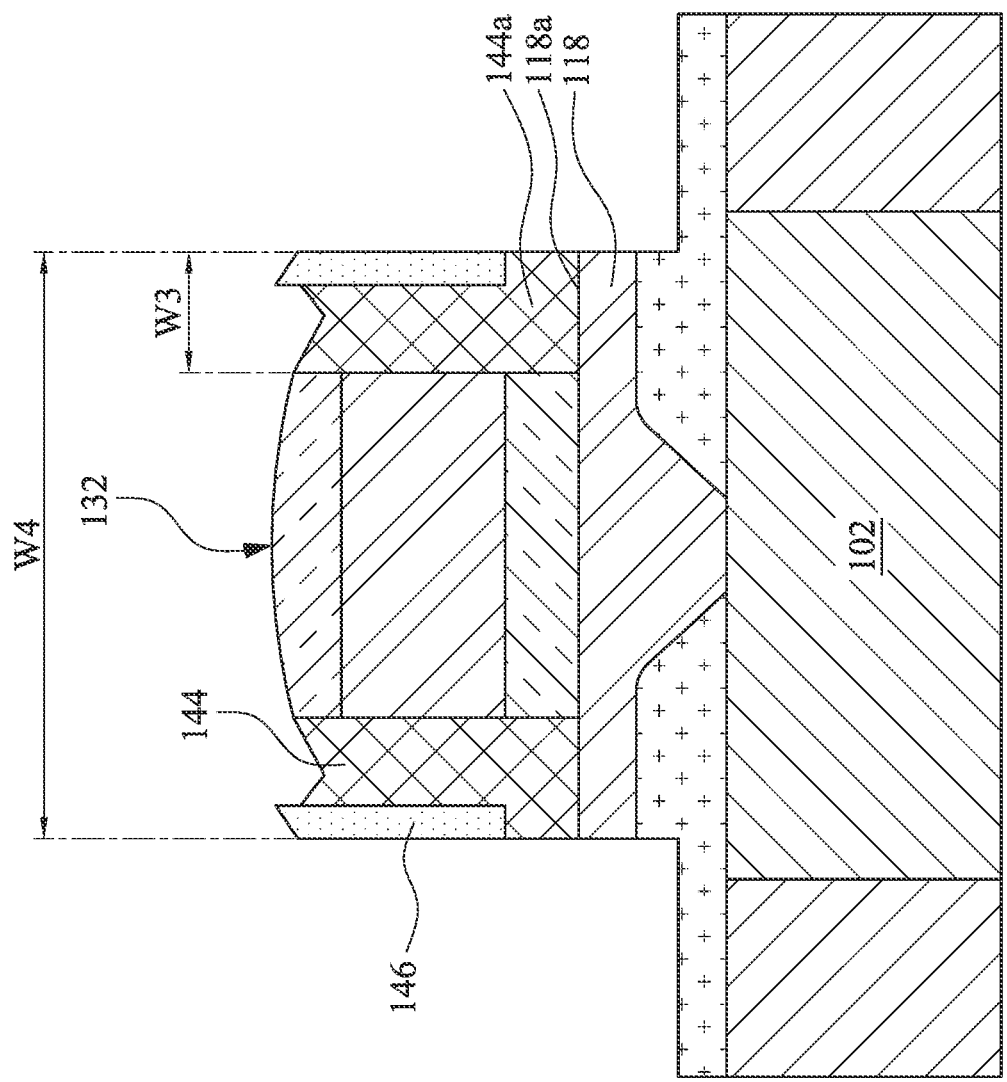

The first electrode layer 116 may be optionally etched so to form the first electrode 118, as shown in FIG. 13, after or during the operation 18 according to some embodiments of the present disclosure. In some examples, the bottom portion 144a of the spacer 144 is positioned on and in contact with the top surface 118a of the first electrode 118. In some examples, the width W3 of the bottom portion 144a of the spacer 144 is approximately 5-30% of the width W4 of the first electrode 118, specifically approximately 10-25% of the width W4.

Figure 14:
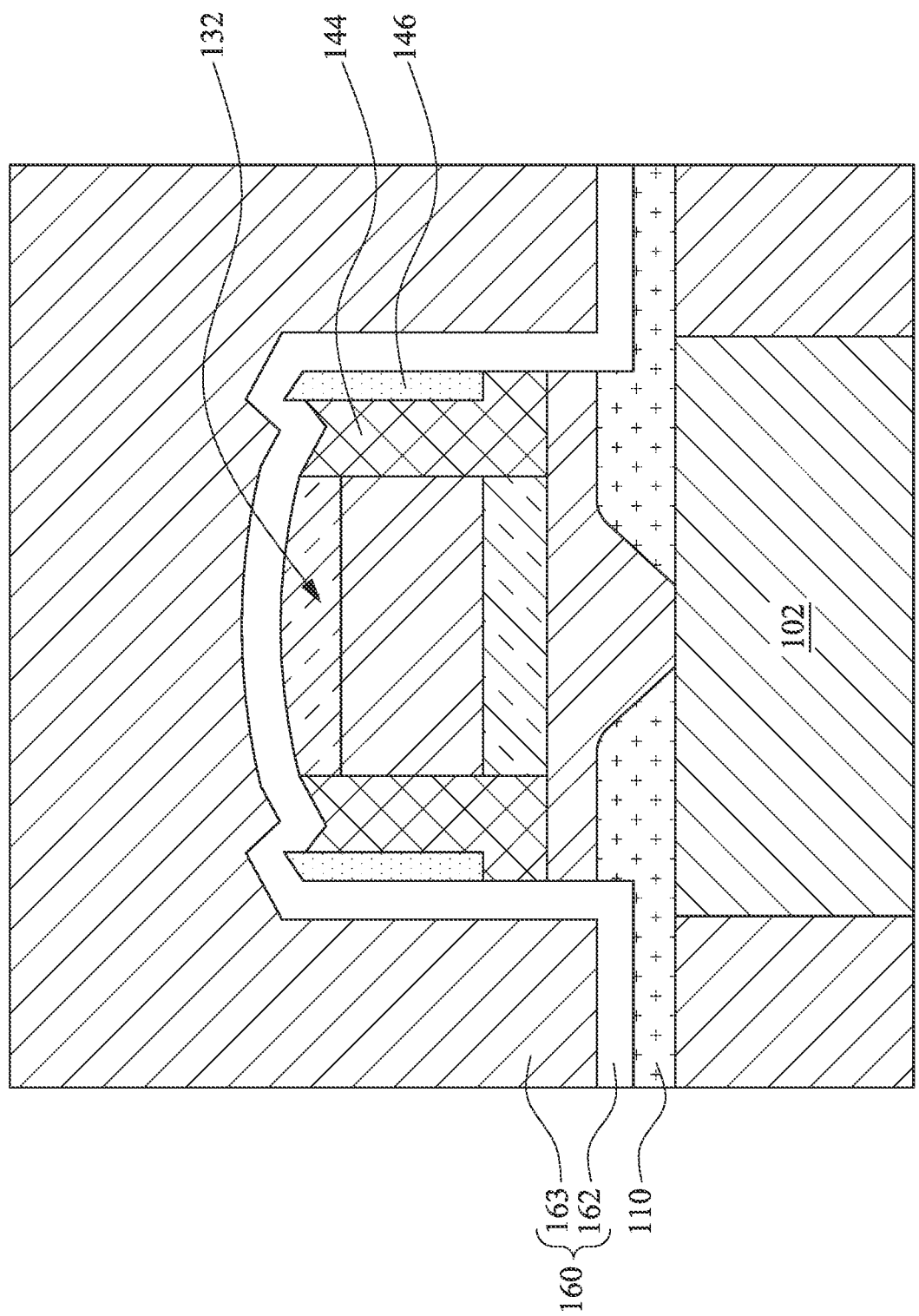

In operation 20, a dielectric layer 160 is formed to cover the stacked feature 132, the spacer 144 and the barrier structure 146, as shown in FIG. 14. In some embodiments, the dielectric layer 160 includes a second dielectric layer 162 and a third dielectric layer 163. The second dielectric layer 162 conformally covers the stacked feature 132, the spacer 144 and the barrier structure 146. The third dielectric layer 163 is deposited on the second dielectric layer 162 and functions as a planarization layer.

Figure 15:
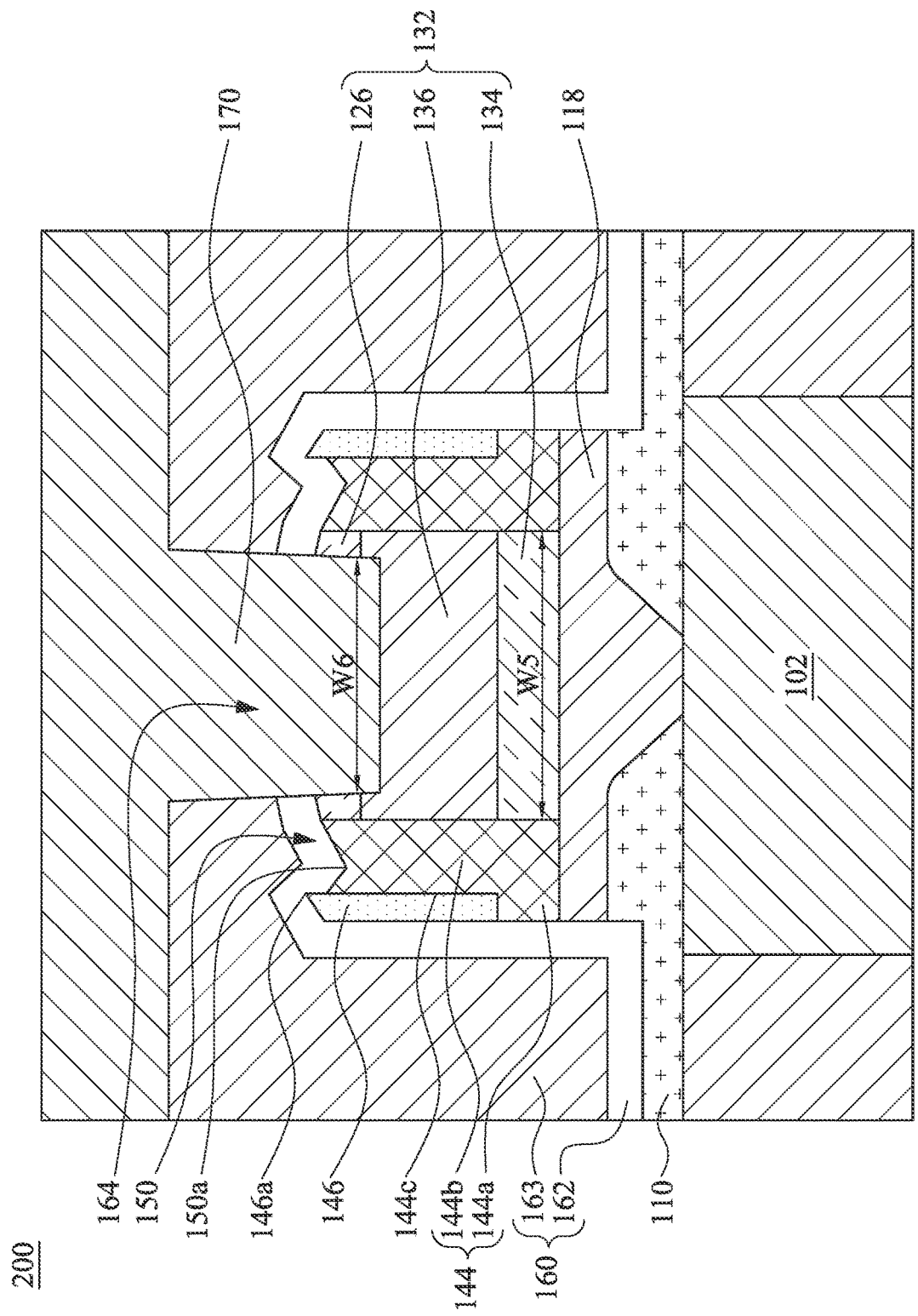

According to various embodiments of the present disclosure, the method 10 may optionally include other operations or acts after the operation 20. As shown in FIG. 15, an opening 164 may be formed in the dielectric layer 160 at a position aligned with the stacked feature 132 such that a portion of the second electrode 136 is exposed. When a part of the patterned mask layer 126 is reminded on the second electrode 136, the opening 164 further passes through the reminded patterned mask layer 126. After the opening 164 is formed, a second conductive via plug 170 is formed in the opening 164 and in contact with the second electrode 136.

As described hereinbefore, some processes in advanced techniques, such as for example Node 40, suffer the misalignment problems. In these advanced techniques, the width W5 of the second electrode 136 (or the storage element 134) is further decreased, and the design rule may render the width W6 of the opening 164 (or the second conductive via plug 170) being greater than 60% of the width W5 of the second electrode 136, so that the misalignment possibility in forming the opening 164 undesirably increases.

Figure 16:
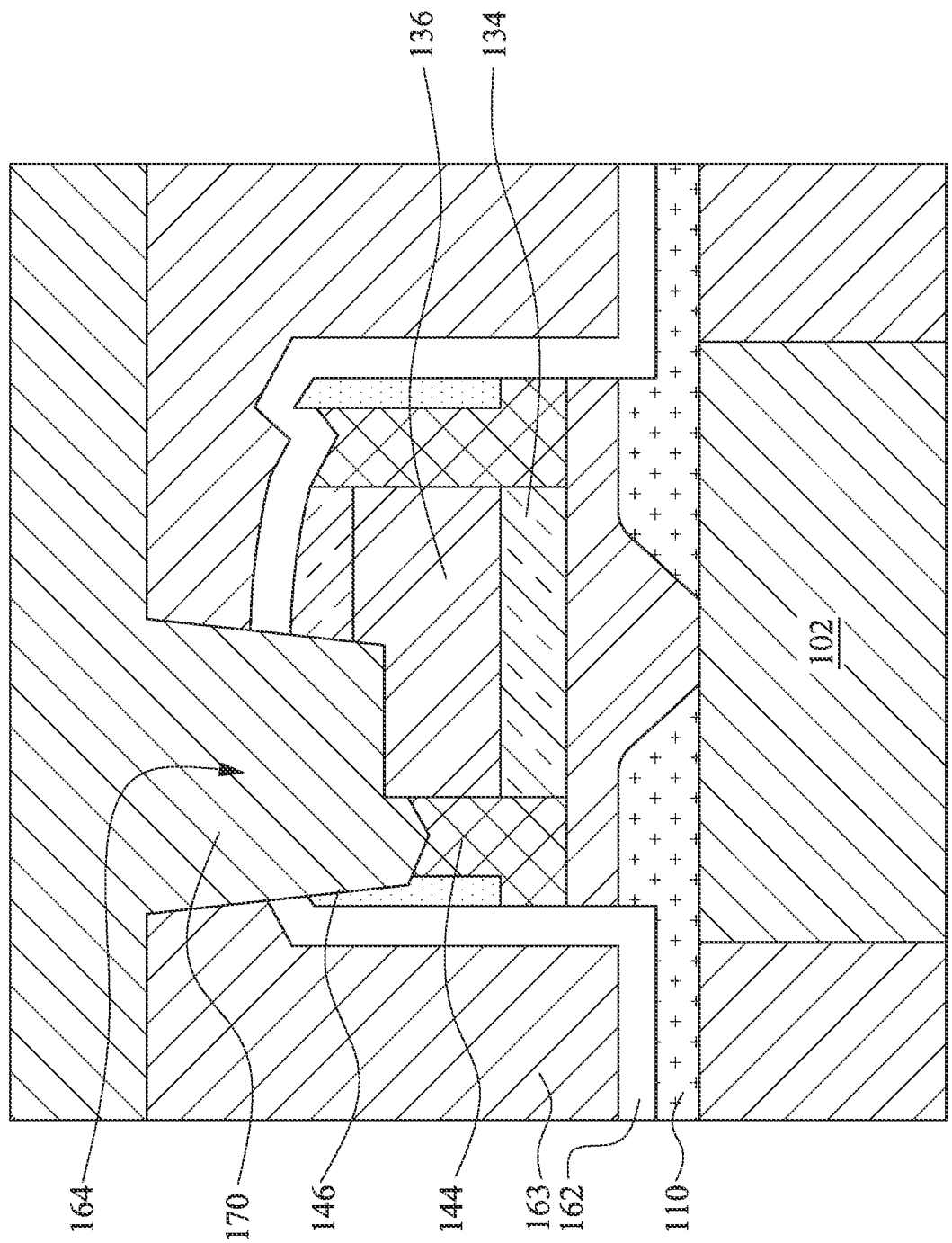
FIG. 16 is a cross-sectional view schematically illustrating a semiconductor device with a misaligned opening according to some embodiments of the present disclosure.

FIG. 16 is a cross-sectional view schematically illustrating a semiconductor device with a misaligned opening 164. When misalignment occurs in the photo process of forming the opening 164, the spacer 144 has an enough thickness to confront the subsequent etching in the area out of the second electrode 136. The remained spacer 144 still provides sufficient isolation or barrier between the follow-up conductive via plug 170 and each of the first electrode 118 and the storage element 134. Therefore, although such misalignment occurs, the semiconductor device is still workable.

According to another aspect of the present disclosure, a semiconductor device such as for example a storage device is provided. FIG. 15 also illustrates a cross-sectional view of a storage device 200 according to various embodiments of the present disclosure. The storage device 200 includes a first electrode 118, a second electrode 136, a storage element 134, a spacer 144 and a barrier structure 146.

The first electrode 118 and the second electrode 136 are opposite to each other. In some embodiments, the second electrode 136 is disposed over the first electrode 118, and the width of the second electrode 136 is smaller than the width of the first electrode 118. In some examples, the first electrode layer 116 may include Ti, Ta, TiN, TaN, or other suitable metals or materials. Similarly, second electrode 136 may include Ti, Ta, TiN, TaN, or other suitable metals or materials.

The storage element 134 is disposed between the first electrode 118 and the second electrode 136. In some embodiments, the storage element 134 includes a free synthetic antiferromagnetic ("SAP") layer, a pinned SAF layer and a tunnel barrier layer interposed there between. In some embodiments, the storage element 134 may include materials used in RRAMs or CBRAMs. For example, the storage material layer 120 may include $Ge_2Sb_2Te_5$, $AgInSbTe$, $NiO$, $TiO_2$, $Sr(Zr)TiO_3$, $GeS$, $GeSe$, $Cu_2S$, or the like, or a combination thereof.

The spacer 144 is formed on a sidewall of the second electrode 136, and the spacer 144 has a notch 150 positioned on a top surface of the spacer 144. In some embodiments, the spacer 144 is directly attached to both of the sidewalls of the second electrode 136 and the storage element 134. In yet some embodiments, the spacer 144 includes a bottom portion 144a and a standing portion 144b extending upwards from the bottom portion 144a, in which the width W3 of the bottom portion 144a (indicated in FIG. 12) is greater than the width W2 of the standing portion 144b. In some embodiments, the width W3 of the bottom portion 144a of the spacer 144 is approximately 5-30% of the width W4 of the first electrode 118 (indicated in FIG. 13). In some examples, the bottom portion 144a is positioned on and in contact with a top surface 118a of the first electrode 118 (indicated in FIG. 13).

Referring to FIG. 15, the barrier structure 146 is embedded in a lateral 144c of the spacer 144. It is noted that the barrier structure 146 has a top 146a extending upwards past the bottom 150a of the notch 150. In some embodiments, the distance D between the top 146a of the barrier structure 146 and the bottom 150a of the notch 150 defines the depth D of the notch 150, and the depth D of the notch 150 is approximately 3-30% of the height H of the barrier structure 146, as shown in FIG. 12. In some embodiments, the barrier structure 146 stands on the bottom portion 144a of the spacer 144 and further in contact with the lateral 144c of the standing portion 144b. In yet some embodiments, the width W1 of the barrier structure 146 (indicated in FIG. 12) is approximately 5-35% of the width W2 of the standing portion 144b.

According to various embodiments, the storage device 200 further includes a first conductive via plug 102 and a second conductive via plug 170. The first conductive via plug 102 is disposed below the first electrode 118, whereas the second conductive via plug 170 is disposed above the second electrode 136. Further, the first conductive via plug 102 and the second conductive via plug 170 are respectively in contact with the first electrode 118 and the second electrode 136.

In some embodiments, the width W6 of the second conductive via plug 170 is approximately 60-180% of a width W5 of the storage element 134. In some examples, the width W6 of the second conductive via plug 170 is approximately 60-100% of the width W5 of the storage element 134. In yet some examples, the width W6 of the second conductive via plug 170 is approximately 100-180% of a width W5 of the storage element 134.

According to some embodiments, a device includes a first conductive via plug, a first electrode, a storage element, a second electrode, a spacer, a barrier structure, a first dielectric layer. The first electrode is over the first conductive via plug. The storage element is over the first electrode. The second electrode is over the storage element. The spacer has a bottom portion extending along a top surface of the first electrode and a standing portion extending from the bottom portion and along a sidewall of the second electrode. The barrier structure extends from the bottom portion of the spacer and along a sidewall of the standing portion of the spacer. The first dielectric layer is substantially conformally over the spacer and the barrier structure.

According to some embodiments, a device includes a conductive via plug, a first electrode, a storage element, a second electrode, a spacer, and a barrier structure. The first electrode is over the conductive via plug. The storage element is over the first electrode. The second electrode is over the storage element. The second electrode is over the storage element. The spacer has a bottom portion extending along a top surface of the first electrode and a standing portion extending from the bottom portion and along and contacting a sidewall of the second electrode. The barrier structure extends from the bottom portion of the spacer and along a sidewall of the standing portion of the spacer.

According to some embodiments, a method includes depositing a first electrode layer over a conductive via plug. The storage element layer is deposited over the first electrode layer. The second electrode layer is deposited over the storage element layer. The second electrode layer and the storage element layer are etched to form a stack feature over the first electrode layer. The spacer layer is deposited over the stack feature and the first electrode layer. The barrier structure layer is deposited over the spacer layer. After the barrier structure layer is deposited, the barrier structure layer and the spacer layer are etched to remove a portion of the barrier structure layer and a portion of the spacer layer from a top surface of the stack feature and to form a spacer adjacent a sidewall of the stacked feature and a barrier structure adjacent a sidewall of the spacer.

What is claimed is:

1. A memory device, comprising:
   a bottom electrode;

a magnetic tunnel junction (MTJ) structure over the bottom electrode, the bottom electrode having a top surface extending past opposite sidewalls of the MTJ structure;
an inner spacer contacting the top surface of the bottom electrode and one of the opposite sidewalls of the MTJ structure; and
an outer spacer contacting an outer sidewall of the inner spacer, the outer spacer protruding from a top surface of the inner spacer by a step height, wherein the outer spacer has a bottom surface higher than the top surface of the bottom electrode.

2. The memory device of claim 1, wherein the top surface of the inner spacer has a different shape than a top surface of the outer spacer.

3. The memory device of claim 1, further comprising:
a top electrode over the MTJ structure; and
a via structure over the top electrode, wherein a bottommost position of the via structure is lower than a topmost position of the inner spacer.

4. The memory device of claim 3, wherein the via structure is laterally spaced apart from the inner spacer by a non-zero distance.

5. The memory device of claim 3, wherein the via structure is in contact with the top surface of the inner spacer.

6. The memory device of claim 3, wherein the via structure has a bottom portion inlaid in the top electrode.

7. The memory device of claim 3, wherein a width of the via structure is greater than 60% of a width of the top electrode.

8. The memory device of claim 1, wherein the top surface of the inner spacer has a V-shaped cross-section.

9. The memory device of claim 1, wherein the inner spacer has a thickness greater than a thickness of the outer spacer.

10. The memory device of claim 1, wherein the outer spacer is an oxide.

11. The memory device of claim 10, wherein the inner spacer includes a different material than the oxide.

12. A memory device, comprising:
a bottom electrode;
a magnetic tunnel junction (MTJ) structure on a first region of the bottom electrode;
a top electrode over the MTJ structure;
an inner spacer having a first portion on a second region of the bottom electrode, and a second portion over the first portion and alongside the MTJ structure and the top electrode; and
an outer spacer on a top surface of the first portion of the inner spacer and alongside the second portion of the inner spacer, wherein the outer spacer having comprises a top surface higher than a top surface of the second portion of the inner spacer by a step height, and the top surface of the outer spacer non-overlaps the top surface of the second portion of the inner spacer, wherein the outer spacer further comprises a bottom surface higher than a top surface of the bottom electrode.

13. The memory device of claim 12, wherein the outer spacer is thinner than the inner spacer.

14. The memory device of claim 12, wherein the top surface of the outer spacer has an inner edge closest to the inner spacer and an outer edge farthest from the inner spacer, and the inner edge of the outer spacer is higher than the outer edge of the outer spacer.

15. The memory device of claim 12, wherein the top surface of the second portion of the inner spacer has two peaks and a valley between the peaks.

16. The memory device of claim 15, further comprising:
a dielectric layer in contact with the peaks and the valley of the top surface of the second portion of the inner spacer.

17. A memory device, comprising:
a bottom electrode;
a magnetic tunnel junction (MTJ) structure over the bottom electrode, the MTJ structure having a sidewall laterally set back from a sidewall of the bottom electrode;
a top electrode over the MTJ structure;
an inner spacer having a first portion extending laterally along a top surface of the bottom electrode, and a second portion extending upwards from the first portion along the sidewall of the MTJ structure and a sidewall of the top electrode, the second portion having a recessed region on an upper end of the second portion; and
an outer spacer extending upwards from a top surface of the first portion of the inner spacer along an outer sidewall of the second portion of the inner spacer to a position higher than the recessed region of the second portion of the inner spacer, the recessed region of the second portion of the inner spacer being spaced apart from the outer spacer, wherein the outer spacer is separated from the bottom electrode.

18. The memory device of claim 17, wherein the recessed region of the second portion of the inner spacer is higher than a top surface of the top electrode.

19. The memory device of claim 17, wherein the recessed region of the second portion of the inner spacer is lower than a top surface of the top electrode.

20. The memory device of claim 17, further comprising:
a dielectric layer over the outer spacer and the inner spacer, wherein the dielectric layer is in contact with an inner sidewall of the outer spacer.

* * * * *